United States Patent
Chen et al.

(10) Patent No.: US 7,884,674 B2
(45) Date of Patent: Feb. 8, 2011

(54) CLOCK AND DATA RECOVERY CIRCUIT

(75) Inventors: I-Fong Chen, Taipei (TW); Shen-Iuan Liu, Taipei (TW)

(73) Assignee: National Taiwan University, Taipei (TW)

( * ) Notice: Subject to any disclaimer, the term of this patent is extended or adjusted under 35 U.S.C. 154(b) by 48 days.

(21) Appl. No.: 12/536,448

(22) Filed: Aug. 5, 2009

(65) Prior Publication Data

US 2010/0289593 A1    Nov. 18, 2010

(30) Foreign Application Priority Data

May 13, 2009    (TW) .............................. 98115790 A

(51) Int. Cl.
*H03L 7/08*    (2006.01)
*H03L 7/085*    (2006.01)
*H04B 1/16*    (2006.01)

(52) U.S. Cl. ............................ 331/1 A; 331/17; 331/25; 455/260

(58) Field of Classification Search .................. 331/1 A, 331/16–18, 25; 327/156–159; 332/127; 360/51; 375/376; 455/260
See application file for complete search history.

(56) References Cited

U.S. PATENT DOCUMENTS 5,128,958 A * 7/1992 Kingston et al. ............ 375/130

* cited by examiner

*Primary Examiner*—David Mis

(57) ABSTRACT

An embodiment of the invention provides a clock and data recovery circuit. The clock and data recovery circuit comprises a phase detector, a pre-accumulator, a register, an accumulator and a digital controlled oscillator. By using the transmission path formed by the pre-accumulator, the output of the phase detector can be transmitted to the digital controlled oscillator in advance to adjust the frequency of its output clock signal and the latency due to the accumulator can be reduced.

24 Claims, 9 Drawing Sheets

US 7,884,674 B2

CLOCK AND DATA RECOVERY CIRCUIT

CROSS REFERENCE TO RELATED APPLICATIONS

This Application claims priority of Taiwan Patent Application No. 098115790, filed on May 13, 2009, the entirety of which is incorporated by reference herein.

BACKGROUND OF THE INVENTION

1. Field of the Invention

The present invention relates to a clock and data recovery circuit, and in particular relates to an all digital clock and data recovery circuit.

2. Description of the Related Art

Demand for large off-chip IO bandwidth requires many serial links on a chip. The serial links need to be low-powered, compatible to different technologies, and operate reliably in noisy environments. One example of a serial link component is a clock and data recovery (CDR) circuit.

While analog CDR circuits have good performance, it takes time for analog CDR circuits to be ported to different technology. For a digital CDR circuit, it is insusceptible to leakage, does not need the passive elements, and prohibits quick production-level testing.

BRIEF SUMMARY OF THE INVENTION

An embodiment of the invention provides a clock and data recovery (CDR) circuit. The CDR circuit comprises a phase detector, a pre-accumulator, a register, an accumulator, and a digital controlled oscillator. The phase detector receives a data signal and a clock signal to output a first phase difference signal and a second phase difference signal. The pre-accumulator accumulates the first phase difference signal and the second phase difference signal to generate a first accumulator value. The register stores a second accumulator value, and receives and temporally stores the first accumulator value from the pre-accumulator during a first cycle of a first clock signal. The accumulator stores a third accumulator value, outputs the third accumulator value during a second cycle of a second clock signal, and receives and temporally stores the second accumulator value from the register during the first cycle of the first clock signal, wherein the second cycle of the second clock signal lags behind the first cycle of the first clock signal by 90 degree phase. The digital controlled oscillator adjusts the frequency and the phase of the clock signal according to the first accumulator value and the third accumulator value.

Another embodiment of the invention provides a receiver comprising a transimpedance amplifier, an amplitude limiter, a CDR circuit and a demultiplexer. The transimpedance amplifier receives and amplifies a radio frequency signal to output a first signal. The amplitude limiter receives and limits the amplitude of the first signal to generate a second signal. The CDR circuit receives and processes the second signal to generate a third signal. The demultiplexer receives and processes the third signal to output an output signal.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
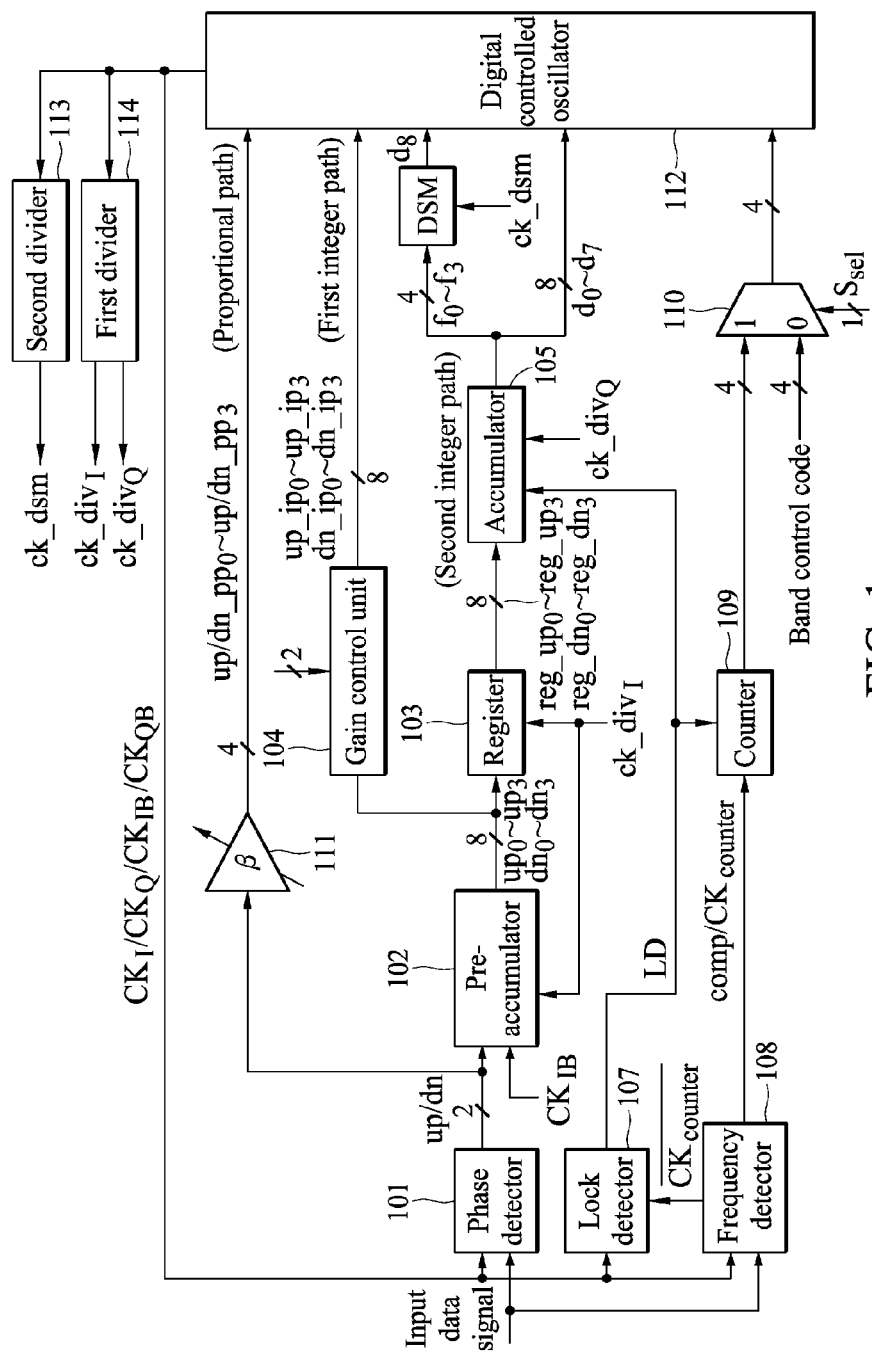
FIG. 1 is a schematic diagram of an embodiment of a clock and data recovery circuit according to the invention.

FIG. 1 is a schematic diagram of an embodiment of a clock and data recovery circuit according to the invention. The clock and data recovery circuit first uses the frequency detector 108 to lock a frequency to ensure that the output clock signal of the digital controlled oscillator 112 is near to a frequency of the input data. The frequency detector 108 receives and compares the output clock signal of the digital controlled oscillator 112 with the frequency of the input data and outputs a comparison result and a count clock signal. In FIG. 1, the output clock signals of the digital controlled oscillator 112 are labeled as $CK_I$, $CK_Q$, $CK_{IB}$ and $CK_{QB}$, wherein the clock signal $CK_{IB}$ is the inverted signal of the clock signal $CK_I$, and the clock signal $CK_{QB}$ is the inverted signal of the clock signal $CK_Q$. The comparison result output by the frequency detector 108 is labeled as "comp", and the count clock signal is labeled as $CK_{counter}$. The counter 109 receives and counts the count clock signal until a frequency difference between the output clock signal of the digital controlled oscillator 112 and the frequency of the input data is less than a predetermined value, and transmits a count value to the multiplexer 110.

The multiplexer 110 receives an external band control code and the count value from the counter 109, and selects one of the external band control code or the count value to initially set the output frequency of the digital controlled oscillator 112 according to a select signal $S_{sel}$. In another embodiment, the digital controlled oscillator 112 is initially set by the external band control code, and then the digital controlled oscillator 112 adjusts its output frequency according to the count value output by counter 109. In one embodiment, if the frequency detector 108 determines that the frequency difference between the output clock signal of the digital controlled oscillator 112 and the frequency of the input data is larger than the predetermined value, and the comparison output of frequency detector 108 is at high voltage level, the counter 109 receives and counts the count clock signal. The lock detector 107 receives the inverted count clock signal $\overline{CK_{counter}}$ and the output clock signal of the digital controlled oscillator 112. When the lock detector 107 determines that the frequency of the output clock signal of the digital controlled oscillator 112 is locked, the lock detector 107 outputs a lock signal LD to enable the accumulator 105.

Figure 2:
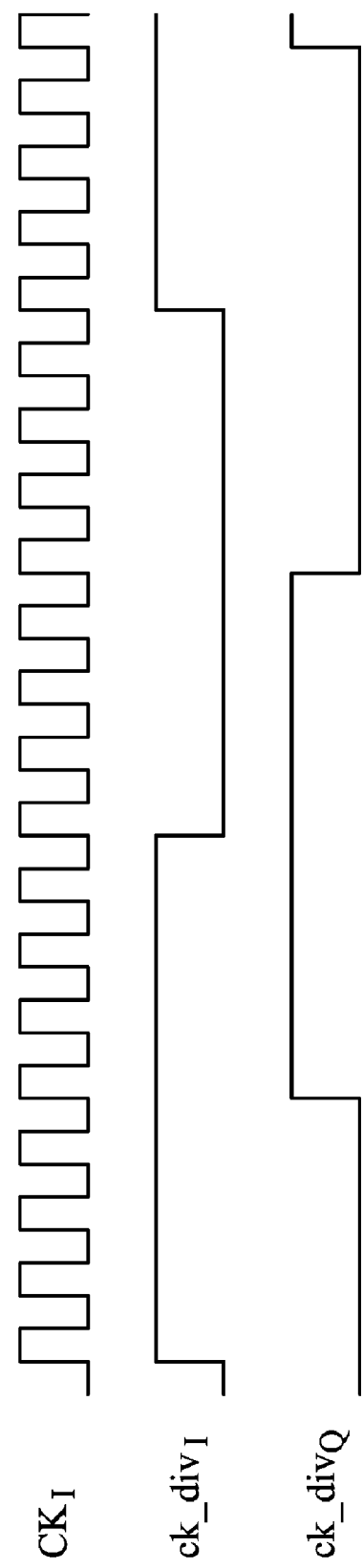
FIG. 2 is a waveform of the first clock signal ck_divI and the second clock signal ck_divQ.

In FIG. 1, the output clock signal of the digital controlled oscillator 112 is also transmitted to the first divider 114 and the second divider 113. The first divider 114 has a first divisor to receive the output clock signal of the digital controlled oscillator 112 to generate a first clock signal ck_div$_I$ and a second clock signal ck_div$_Q$. The second divider 113 has a second divisor to receive the output clock signal of the digital controlled oscillator 112 to generate a third clock signal ck_dsm. In this embodiment, the first divisor is 16 and the second divisor is 2. Please refer to FIG. 2 for more details concerning the first clock signal ck_div$_I$ and the second clock signal ck_div$_Q$. FIG. 2 is a waveform of the first clock signal ck_div$_I$ and the second clock signal ck_div$_Q$. In FIG. 2, the cycles of the first clock signal ck_div$_I$ and the second clock signal ck_div$_Q$ are 16 cycles of clock CK$_F$, and the phase of the second clock signal ck_div$_Q$ lags behind the phase of the first clock signal ck_div$_I$ by 90 degree.

The phase detector 101 receives the input data signal and the output clock signal of the digital controlled oscillator 112 to output a first phase differential signal up and a second phase differential signal dn. The first phase differential signal up and the second phase differential signal dn are transmitted to a gain control unit 104 to generate a second tuning word to the digital controlled oscillator 112 to adjust the frequency of the output clock of the digital controlled oscillator 112. The path from the phase detector 101 to the digital controlled oscillator 112 via the gain control unit 104 is called a proportional path, and the second tuning word is labeled as up/dn_pp$_0$~up/dn_pp$_3$. If the gain, β, of the gain control unit 104 is small, it means that the latency has decreased, and the clock and data recovery circuit therefore has minimal jitter and the phase margin thereof is not scarified.

The first phase differential signal up and the second phase differential signal dn are also transmitted to the pre-accumulator 102 to generate first accumulated values up$_0$~up$_3$ and dn$_0$~dn$_3$. The first accumulated value is first transmitted to the digital controlled oscillator via the first integer path, thus, the latency caused by the accumulator 105 is reduced. In the first integer path, a gain unit is included. The gain unit receives the first accumulated value and discards at least one bit data of the first accumulated value to generate a first tuning word. Therefore, the digital controlled oscillator can adjust the frequency of the clock signal according to the first accumulated values up$_0$~up$_3$ and dn$_0$~dn$_3$.

The first accumulated values up$_0$~up$_3$ and dn$_0$~dn$_3$ are also transmitted to the register 103 after the data original stored in the register 103 is transmitted to the accumulator 105. The pre-accumulator 102 and the register 103 are also controlled by a first clock signal ck_div$_I$. When the first clock signal ck_div$_I$ is at logic high level, the pre-accumulator 102 is reset and the first accumulated values up$_0$~up$_3$ and dn$_0$~dn$_3$ are transmitted to the register 103. When the clock signal ck_div$_Q$ is at logic high level, the register 103 transmits its stored data, reg_uo$_0$~reg_up$_3$ and reg_dn$_0$~reg_dn$_3$, to the accumulator 105.

In this embodiment, the accumulator 105 is a 12-bits accumulator and divides the accumulated value into a fourth accumulated value with 4 bits and a fifth accumulated value, d$_1$~d$_7$, with 8 bits. The fourth accumulated value is transmitted to a resolution enhancement unit to generate a third tuning word d$_8$ to adjust the resolution of the digital controlled oscillator 112. In this embodiment, the resolution enhancement unit is a delta-sigma modulator (DSM) and generates the third tuning word d$_8$ by time-averaging technology.

In this embodiment, the pre-accumulator 102 comprises two 4-bit accumulators, thus, the pre-accumulator 102 can operate under the environment of a higher frequency. The accumulator 105 cannot operate at a high frequency which is the same as the clock signal used by the pre-accumulator 102 because the accumulator 105 has more bits. Furthermore, the pre-accumulator 102 can operate at the same frequency of the input data signal. According to the above description, the digital controlled oscillator 112 can be controlled by different parameters, such as the output signal of the multiplexer 110, the first tuning word, the second tuning word, the third tuning word, the fifth tuning word, and adjust the frequency of the output clock signal of the digital controlled oscillator 112. However, the smallest frequency adjustment ranges which can be adjusted by different parameters are different.

Figure 3:
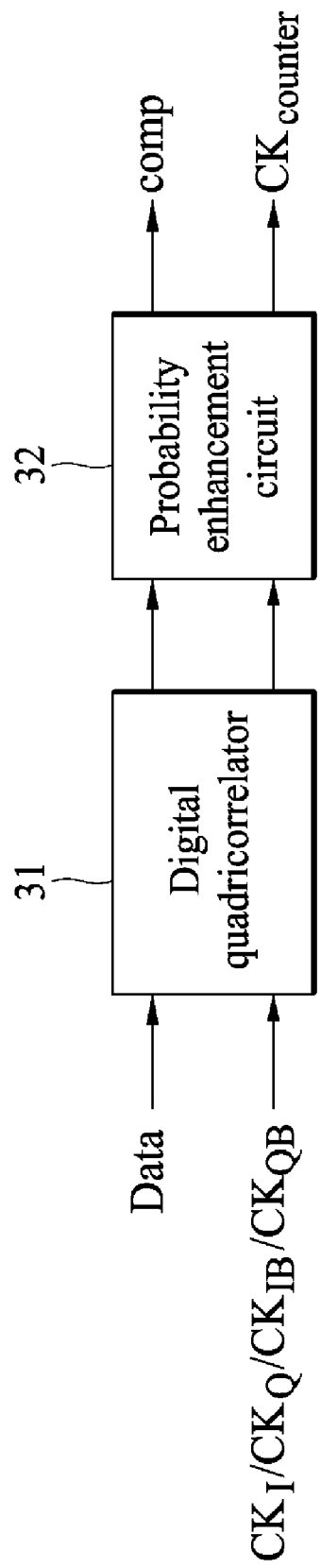
FIG. 3 is a schematic diagram of the frequency detector according to an embodiment of the invention.

FIG. 3 is a schematic diagram of the frequency detector according to an embodiment of the invention. The digital quadricorrelator 31 uses the concept of the state diagram to decide the relation between the clock and data frequency, such as CK$_I$, CK$_Q$, CK$_{IB}$ and CK$_{IQ}$. The digital quadricorrelator 31 outputs and transmits the phase difference signals U and D to the probability enhancement circuit 32 to generate the comparison result, comp, and count clock signal CK$_{counter}$. The digital quadricorrelator 31 is composed of an edge detector, six DFFs, and the combinational circuit. A detailed circuit of digital quadricorrelator 31 is shown in FIG. 4.

Figure 4:
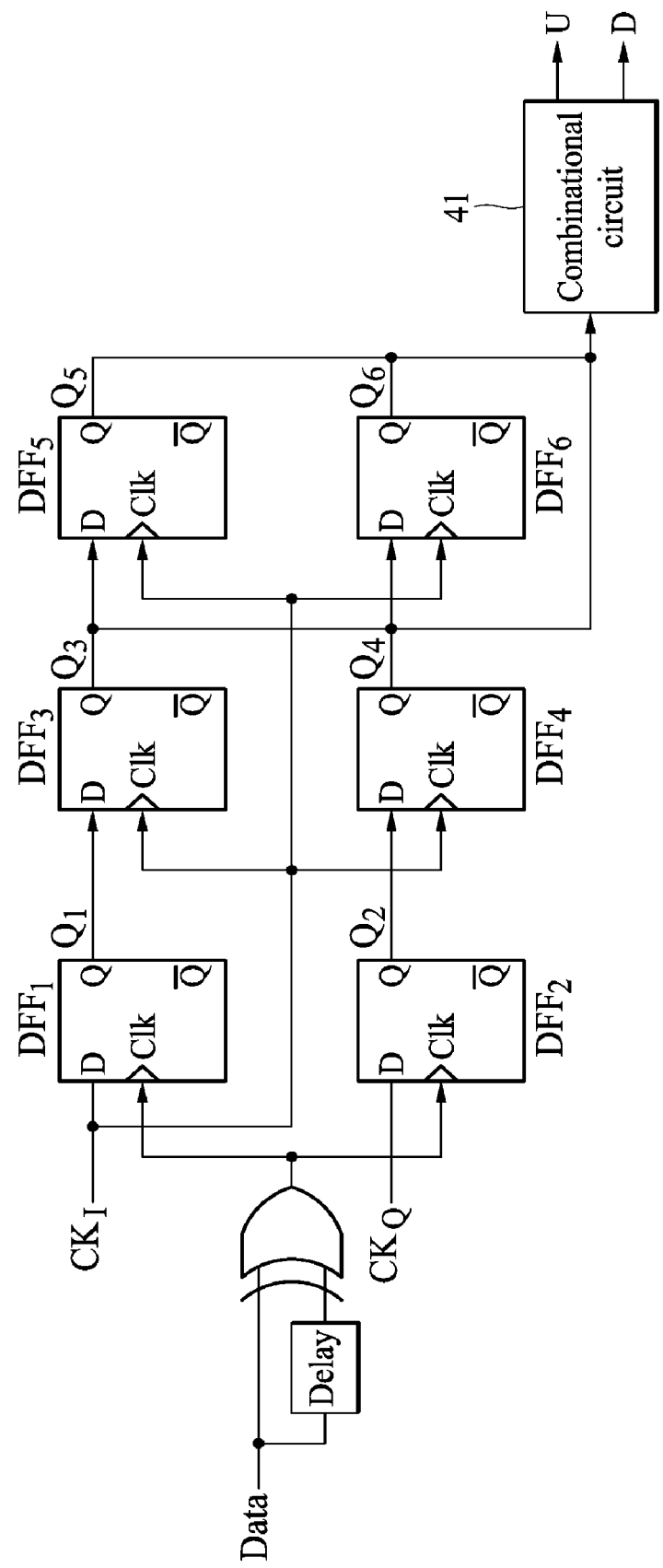
FIG. 4 is a schematic diagram of an embodiment of digital quadricorrelator 31 according to the invention.

FIG. 4 is a schematic diagram of an embodiment of digital quadricorrelator 31 according to the invention. The CK$_I$ and CK$_Q$ is sampled by input data signal by d flip-flops DFF$_1$ and DFF$_2$. The present value and the previous value of states are stored in DFF$_3$~DFF$_4$ and DFF$_5$~DFF$_6$, respectively. The combinational circuit 41 determines the relation between the data rate and the clock frequency depending on outputs of DFF$_3$~DFF$_6$. Table 1 is the truth table of the combinational circuit.

TABLE 1

|  |  | Previous State Q5Q6 | | | |
|---|---|---|---|---|---|
| Present State Q3Q4 |  | State I 10 | State II 11 | State III 01 | State IV 00 |
| State I | 10 | X | U | X | D |
| State II | 11 | D | X | U | X |
| State III | 01 | X | D | X | U |
| State IV | 00 | U | X | D | X |

The cross X in Table 1 represents that the digital quadricorrelator 31 does not make any determinations. However, the probability of the correct detection only by the digital quadricorrelator 31 in FIG. 3 is only 75%. To increase probability of the correct detection of the digital quadricorrelator 31, a probability enhancement circuit 32 is implemented. The detailed circuit architecture of the probability enhancement circuit 32 is shown in FIG. 5.

Figure 5:
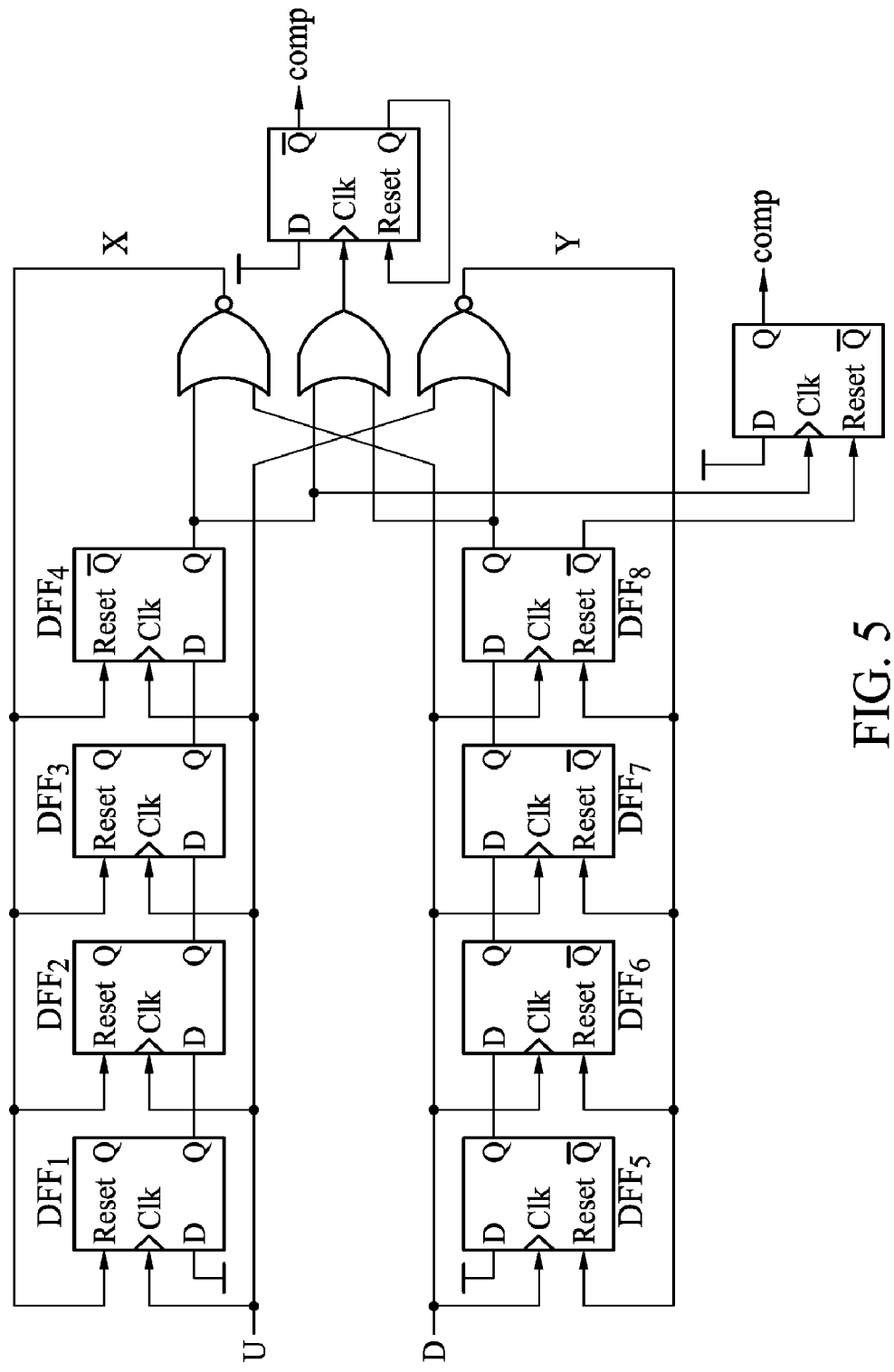
FIG. 5 is a schematic diagram of the probability enhancement circuit 32 according to an embodiment of the invention

FIG. 5 is a schematic diagram of the probability enhancement circuit 32 according to an embodiment of the invention. Basically the circuit is to detect 4 consecutive signals U or D. If the signal D arises before the signal U has arisen 4 times, the D flip-flops DFF$_1$~DFF$_4$ are reset. If there is no signal D found before the signal U has been found 4 times, the signal X arises and the D flip-flops DFF$_1$~DFF$_4$ are reset. The signal Y is generated in the same manner. The detailed operation of the probability enhancement circuit in FIG. 5 can be known by those skilled in the art, and is not described here for brevity. According to the circuit in FIG. 5, the probability can be enhanced to about 99.6%, which implies very accurate frequency detection.

Figure 6:
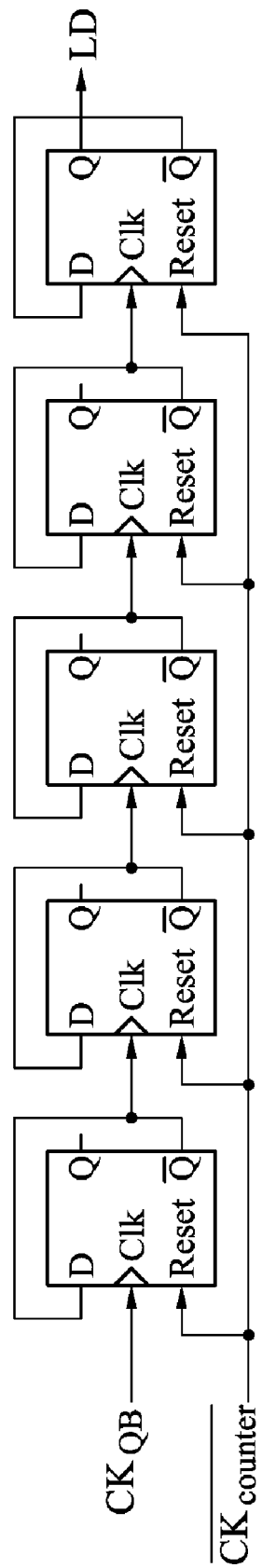
FIG. 6 is a schematic diagram of the lock detector 107 in FIG. 1 according to an embodiment of the invention.

FIG. 6 is a schematic diagram of the lock detector 107 in FIG. 1 according to an embodiment of the invention. The lock detector 107 is composed of five successive D flip-flops. The operation principle of the lock detector 107 is just like a counter to count the number of bits among two consecutive U/D signals. When the frequency of the output clock signal of the digital controlled oscillator 112 is near to the frequency of the input data signal, i.e., the frequency difference therebetween is smaller than a predetermined value, the lock detector 107 outputs the lock signal LD to stop choosing the frequency band code. In other words, the lock signal LD controls the counter 109 to stop counting. In this embodiment, if the smallest frequency offset which can be detected by the lock detector 107 is 10 MHz, i.e, the frequency difference between the frequency of the output clock signal of the digital controlled oscillator 112 and the frequency of the input data signal is smaller than 10 MHz, the lock detector 107 outputs the lock signal LD.

Figure 7:
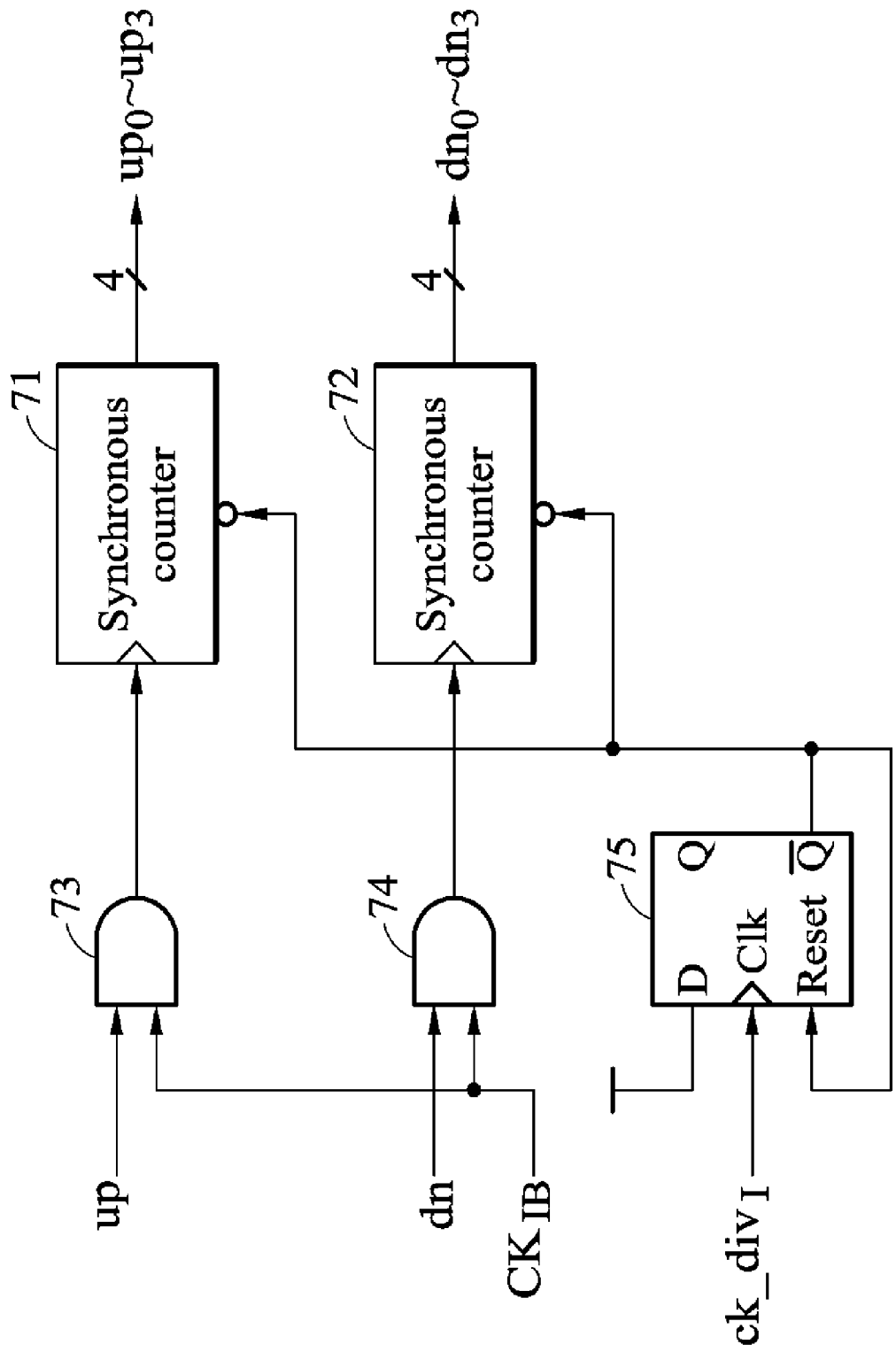
FIG. 7 is a schematic diagram of the pre-accumulator 102 according to an embodiment of the invention.

FIG. 7 is a schematic diagram of the pre-accumulator 102 according to an embodiment of the invention. The pre-accumulator 102 is composed of two 4-bit synchronous counters, two AND gates, and one D flip-flop. When the edge of the clock signal $CK_I$ is rising, the output signal up of the phase detector 101 is at logic "1". When the edge of clock signal $CK_I$ is falling, the output signal up of the phase detector 101 is at logic "0". Thus, we can use the output signals up and dn of the phase detector to generate the trigger signal of the synchronous counters 71 and 72 via the AND gate, and reset the synchronous counter every sixteen clock cycles. The synchronous counter can also be implemented by another accumulator with fewer bits, such 4 bits. Since the synchronous counters 71 and 72 can be operated under the frequency of input data signal, the first integral path from outputs of the synchronous counters 71 and 72 to the DCO 112 has less loop latency.

Figure 8:
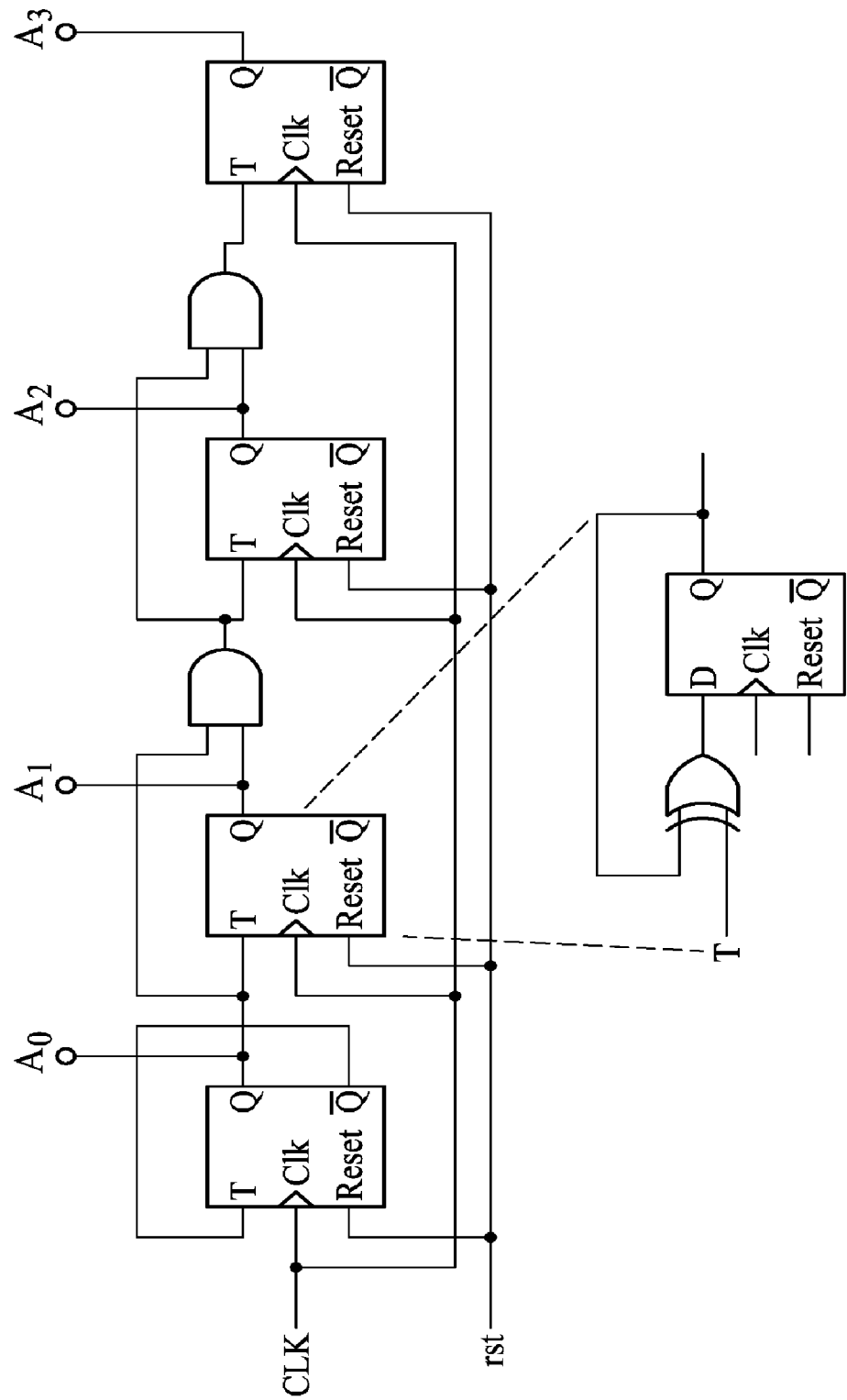
FIG. 8 is a schematic diagram of the synchronous counter according to an embodiment of the invention.

FIG. 8 is a schematic diagram of the synchronous counter according to an embodiment of the invention. The clock signal CLK is the output signal of the AND gate 73 or 74 of FIG. 7, and the reset signal "rst" is the reset signal of the D flip-flop 75. In FIG. 8, the T flip-flop is implemented by a D flip-flop and an exclusive-or gate (XOR gate). By using the synchronous counter in FIG. 8, minimum latency is achieved. Also, only one T Flip-flop delay is increased, which can not be done by the ripple counter although the ripple counter uses less power.

Figure 9:
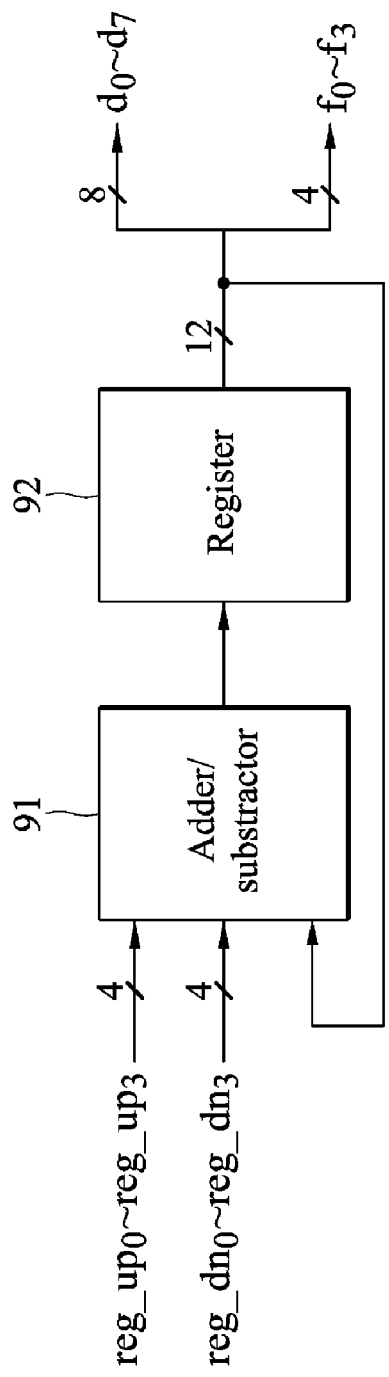
FIG. 9 is a schematic diagram of an embodiment of an accumulator according to the invention.

FIG. 9 is a schematic diagram of an embodiment of an accumulator according to the invention. In FIG. 9, a 12-bits accumulator is illustrated, but the invention is not limited thereto. The 12-bits adder/substractor 91 receives the output of the 12-bits register 92, modifies the $reg\_up_0 \sim reg\_up_3$, and $reg\_dn_0 \sim reg\_dn_3$, and transmits the modified value to the register 92. In other words, the register 92 stores the previous output of adder/substractor 91. The register 92 output two parts of values, $d_0 \sim d_7$ and $f_0 \sim f_3$, wherein the value $d_0 \sim d_7$ is transmitted to the digital controlled oscillator 112 for adjusting the frequency of the output clock signal of the digital controlled oscillator 112, and the value $f_0 \sim f_3$ is transmitted to the delta-sigma modulator to adjust the resolution of the digital controlled oscillator 112.

Figure 10:
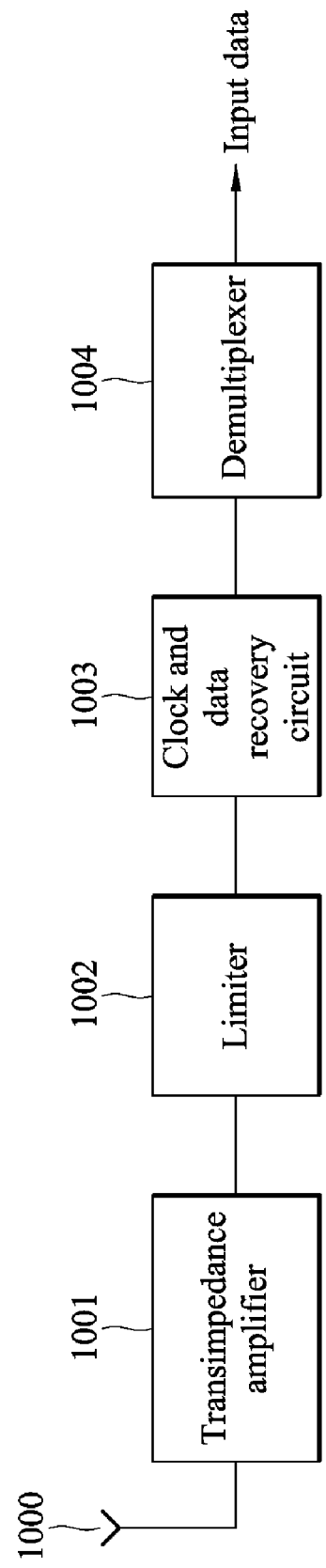
FIG. 10 is a schematic diagram of an embodiment of a receiver using the clock and data recovery circuit of the invention.

FIG. 10 is a schematic diagram of an embodiment of a receiver using the clock and data recovery circuit of the invention. The receiver 1000 comprises a transimpedance amplifier 1001, a limiter 1002, a clock and data recovery circuit 1003 and demultiplexer 1004. The transimpedance amplifier 1001 receives and amplifies a radio frequency signal to output a first signal. The limiter 1002 receives and limits the amplitude of the first signal to generate a second signal. The clock and data recovery circuit 1003, such as shown in FIG. 1, processes the second signal to generate a third signal. The demultiplexer 1004 receives and processes the third signal to output an output data. The clock and data recovery circuit 1003 uses a pre-accumulator to form a transmission path for pre-transmitting the output of the phase detector of clock and data recovery circuit 1003 to a digital controlled oscillator to adjust the frequency of the output clock signal of digital controlled oscillator. Thus, latency caused by the accumulator of the clock and data recovery circuit 1003 can be decreased.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A clock and data recovery circuit, comprising:
   a phase detector receiving a data signal and a clock signal to output a first phase difference signal and a second phase difference signal;
   a pre-accumulator to accumulate the first phase difference signal and the second phase difference signal to generate a first accumulator value;
   a register storing a second accumulator value, to receive and temporally store the first accumulator value from the pre-accumulator during a first cycle of a first clock signal;
   an accumulator storing a third accumulator value, to output the third accumulator value during a second cycle of a second clock signal, and receive and temporally store the second accumulator value from the register during the first cycle of the first clock signal, wherein the second cycle of the second clock signal lags behind the first cycle of the first clock signal by 90 degree phase; and
   a digital controlled oscillator to adjust the frequency and the phase of the clock signal according to the first accumulator value and the third accumulator value.

2. The clock and data recover circuit as claimed in claim 1, further comprising:
   a gain unit to receive the first accumulator value and discard at least one bit of the first accumulator value to generate a first tuning word, wherein the digital controlled oscillator adjusts the frequency of the clock signal according to the first tuning word.

3. The clock and data recover circuit as claimed in claim 2, further comprising:
   a gain control unit having a gain, to receive the first phase difference signal and the second phase difference signal to generate and transmit a second tuning word to the digital controlled oscillator to adjust the frequency of the clock signal according to the second tuning word.

4. The clock and data recover circuit as claimed in claim 1, wherein the third accumulator value comprises a fourth accumulator value and a fifth accumulator value.

5. The clock and data recover circuit as claimed in claim 4, wherein the accumulator is further coupled to a resolution enhancement unit receiving the fourth accumulator value to generate a third tuning word to adjust the resolution of the digital controlled oscillator.

6. The clock and data recover circuit as claimed in claim 5, wherein the resolution enhancement unit is a delta-sigma modulator.

7. The clock and data recover circuit as claimed in claim 1, further comprising:
- a frequency detector to compare the frequency of the data signal with the frequency of the clock signal to output a response signal when a frequency difference between the clock signal and the data signal is less than a predetermined value; and
- a lock detector to output a lock signal according to the response signal to enable the accumulator.

8. The clock and data recover circuit as claimed in claim 7, further comprising:
- a counter to receive and count a comparison result output by the frequency detector to generate a first band control code; and
- a multiplexer receiving the first band control code and an external second band control code, to select one of the first band control code and the second band control code to set a frequency initial value.

9. The clock and data recover circuit as claimed in claim 1, further comprising:
- a first divider having a first divisor, receiving the clock signal to generate the first clock signal and the second clock signal; and
- a second divider having a second divisor to receive the clock signal to generate a third clock signal.

10. The clock and data recover circuit as claimed in claim 9, wherein the third accumulator value comprises a fourth accumulator value and a fifth accumulator value, and the accumulator is further coupled to a resolution enhancement unit receiving the fourth accumulator value to generate a third tuning word to adjust the resolution of the digital controlled oscillator.

11. The clock and data recover circuit as claimed in claim 9, wherein the first divisor is 16.

12. The clock and data recover circuit as claimed in claim 9, wherein the second divisor is 2.

13. A receiver, comprising:
- a transimpedance amplifier receiving and amplifying a radio frequency signal to output a first signal;
- an amplitude limiter receiving and limiting the amplitude of the first signal to generate a second signal;
- a clock and data recovery circuit as claimed in claim 1 receiving and processing the second signal to generate a third signal; and
- a demultiplexer receiving and processing the third signal to output an output signal.

14. The receiver as claimed in claim 13, further comprising:
- a gain unit to receive the first accumulator value and discard at least one bit of the first accumulator value to generate a first tuning word, wherein the digital controlled oscillator adjusts the frequency of the clock signal according to the first tuning word.

15. The receiver as claimed in claim 14, further comprising:
- a gain control unit having a gain, to receive the first phase difference signal and the second phase difference signal to generate and transmit a second tuning word to the digital controlled oscillator to adjust the frequency of the clock signal according to the second tuning word.

16. The receiver as claimed in claim 13, wherein the third accumulator value comprises a fourth accumulator value and a fifth accumulator value.

17. The receiver as claimed in claim 16, wherein the accumulator is further coupled to a resolution enhancement unit receiving the fourth accumulator value to generate a third tuning word to adjust the resolution of the digital controlled oscillator.

18. The receiver as claimed in claim 17, wherein the resolution enhancement unit is a delta-sigma modulator.

19. The receiver as claimed in claim 13, wherein the clock and data recovery circuit further comprises:
- a frequency detector to compare the frequency of the data signal with the frequency of the clock signal to output a response signal when a frequency difference between the clock signal and the data signal is less than a predetermined value; and
- a lock detector to output a lock signal according to the response signal to enable the accumulator.

20. The receiver as claimed in claim 19, wherein the clock and data recovery circuit further comprises:
- a counter to receive and count a comparison result output by the frequency detector to generate a first band control code; and
- a multiplexer receiving the first band control code and an external second band control code, to select one of the first band control code and the second band control code to set a frequency initial value.

21. The receiver as claimed in claim 13, wherein the clock and data recovery circuit further comprises:
- a first divider having a first divisor, receiving the clock signal to generate the first clock signal and the second clock signal; and
- a second divider having a second divisor to receive the clock signal to generate a third clock signal.

22. The receiver as claimed in claim 21, wherein the third accumulator value comprises a fourth accumulator value and a fifth accumulator value, and the accumulator is further coupled to a resolution enhancement unit receiving the fourth accumulator value to generate a third tuning word to adjust the resolution of the digital controlled oscillator.

23. The receiver as claimed in claim 21, wherein the first divisor is 16.

24. The receiver as claimed in claim 21, wherein the second divisor is 2.

* * * * *